(12) United States Patent
Kim et al.

(10) Patent No.: US 10,191,578 B2
(45) Date of Patent: Jan. 29, 2019

(54) TOUCH SENSOR, MANUFACTURING METHOD THEREOF, AND DISPLAY DEVICE INCLUDING THE SAME

(71) Applicant: SAMSUNG DISPLAY CO., LTD., Yongin-si, Gyeonggi-do (KR)

(72) Inventors: Young Do Kim, Cheonan-si (KR); Hoon Sik Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 217 days.

(21) Appl. No.: 14/990,753

(22) Filed: Jan. 7, 2016

(65) Prior Publication Data

US 2016/0246435 A1   Aug. 25, 2016

(30) Foreign Application Priority Data

Feb. 25, 2015   (KR) ........................ 10-2015-0026799

(51) Int. Cl.

| G06F 3/041 | (2006.01) |
|---|---|
| G06F 3/047 | (2006.01) |
| G06F 3/044 | (2006.01) |
| G03F 7/004 | (2006.01) |
| C23F 1/02 | (2006.01) |
| H05K 3/06 | (2006.01) |
| G03F 7/00 | (2006.01) |

(52) U.S. Cl.

CPC ............ *G06F 3/0416* (2013.01); *G06F 3/044* (2013.01); *G06F 3/047* (2013.01); *G06F 3/0412* (2013.01); *C23F 1/02* (2013.01); *G03F 7/0002* (2013.01); *G03F 7/0041* (2013.01); *G06F 2203/04103* (2013.01); *H05K 3/064* (2013.01); *Y10S 977/742* (2013.01); *Y10S 977/762* (2013.01)

(58) Field of Classification Search
USPC ........................................................ 345/173
See application file for complete search history.

(56) References Cited

U.S. PATENT DOCUMENTS

| 2004/0071870 A1 | 4/2004 | Knowles et al. |
|---|---|---|
| 2008/0292840 A1 | 11/2008 | Majumdar et al. |
| 2013/0056244 A1 | 3/2013 | Srinivas et al. |
| 2013/0100073 A1 | 4/2013 | Wang et al. |
| 2014/0035599 A1 | 2/2014 | Shimata et al. |

(Continued)

FOREIGN PATENT DOCUMENTS

| DE | 20 2012 103 976 U | 12/2012 |
|---|---|---|
| EP | 2 879 032 A1 | 6/2015 |

(Continued)

OTHER PUBLICATIONS

EPO Search Report dated Jul. 8, 2016 issued in European Patent Application No. 16157445.4 (9 pages).

*Primary Examiner* — Jennifer Mehmood
*Assistant Examiner* — Deeprose Subedi
(74) *Attorney, Agent, or Firm* — Lewis Roca Rothgerber Christie LLP

(57) ABSTRACT

A touch sensor includes a touch substrate, a plurality of first touch electrodes extending in a first direction, a plurality of second touch electrodes extending in a second direction crossing the first direction, and a plurality of protrusions on at least one of the plurality of first and second touch electrodes.

30 Claims, 14 Drawing Sheets

(56) References Cited

U.S. PATENT DOCUMENTS

| | | | |
|---|---|---|---|
| 2014/0111709 A1* | 4/2014 | Kim | G02F 1/13338 349/12 |
| 2014/0191431 A1 | 7/2014 | Uehara et al. | |
| 2014/0246225 A1 | 9/2014 | Mizuno et al. | |
| 2016/0253026 A1* | 9/2016 | Long | G03F 7/20 345/174 |
| 2017/0097700 A1* | 4/2017 | Kim | G06F 3/044 |
| 2017/0115764 A1* | 4/2017 | Liu | G06F 3/041 |

FOREIGN PATENT DOCUMENTS

| | | |
|---|---|---|
| KR | 10-2005-0036758 A | 4/2005 |
| KR | 10-2012-0091784 A | 8/2012 |
| KR | 10-1205852 B1 | 11/2012 |

* cited by examiner

TOUCH SENSOR, MANUFACTURING METHOD THEREOF, AND DISPLAY DEVICE INCLUDING THE SAME

CROSS-REFERENCE TO RELATED APPLICATION

This application claims priority to and the benefit of Korean Patent Application No. 10-2015-0026799, filed in the Korean Intellectual Property Office on Feb. 25, 2015, the entire content of which is incorporated herein by reference.

BACKGROUND

1. Field

The present disclosure relates to a touch sensor, a manufacturing method thereof, and a display device including the same.

2. Description of the Related Art

Electronic devices (such as a liquid crystal display (LCD), an organic light emitting diode (OLED) display, or an electrophoretic display) may include a touch sensing function for enabling interaction with a user. A touch sensing function is used to obtain touch information (such as whether an object approaches or contacts a touch screen) and a touch position by sensing a change in pressure, charges, light, etc., that are applied onto the screen of a display device, when a user writes text or draws a figure by approaching or touching the screen using a finger or a touch pen.

Such touch sensing functions of the various electronic devices can be realized by a touch sensor. The touch sensor can be classified into various types (kinds) such as a resistive type, a capacitive type, an electromagnetic (EM) type, an optical type, etc.

For example, in the resistive type of touch sensor, two electrodes separated and facing each other may come into contact due to pressure from an external object. When the two electrodes contact each other, the touch position and/or the like can be determined by detecting a voltage change due to a change in resistance at a touch position.

The capacitive type of touch sensor includes a sensing capacitor including a plurality of sensing electrodes for transmitting a detection signal, and determines whether a touch occurs or not and a touch position by detecting a change in capacitance of the sensing capacitor or an amount of charge when a conductor such as a finger approaches the touch sensor. The capacitance type of touch sensor may include a plurality of touch electrodes for sensing the touch, which are located in a touch sensing area to sense a touch, and signal-transmitting wiring connected to the touch electrodes. The signal-transmitting wiring may transmit a sensing input signal to the touch electrodes, and/or may transmit a sensing output signal of the touch electrodes generated by the touch to a sensing signal controller.

In general, the signal-transmitting wiring may be located in a peripheral area around a touch sensing area of a touch sensing panel and/or in the touch sensing area.

When a heavy and fragile glass substrate is used in the various electronic devices such as the display devices and the like, there are some limitations in portability and large screen display. Therefore, recently, a flexible display device using a plastic substrate, which is light, strong against impacts, and/or highly flexible, as a substrate has been actively developed. Accordingly, the touch sensor attached to or integrated into the electronic devices should also have flexibility.

Recently, flexible touch sensors that are actively being developed may include, for example, a transformable part that is foldable/bendable, rollable, stretchable in at least one direction, and/or elastic. The flexible touch sensor includes a plurality of touch electrodes, and the touch electrodes may have flexibility to prevent defects after being transformed.

For example, as a material for forming the flexible touch electrodes, various materials such as a metal nanowire such as a silver nanowire (AgNw), carbon nanotubes, graphene, a metal mesh, and/or a conductive polymer have been developed.

The above information disclosed in this Background section is only for enhancement of understanding of the background of the invention and therefore it may contain information that does not form the prior art that is already known in this country to a person of ordinary skill in the art.

SUMMARY

Some aspects of some embodiments of the present invention are directed toward a touch sensor without a separate adhesive or adhesives, and a manufacturing method.

Some aspects of some embodiments of the present invention are directed toward a touch sensor with a thinner thickness and a display device including the same.

Some aspects of some embodiments of the present invention are directed toward a display device preventing a touch sensor from being separated from a polarizer or a touch panel even when the display device is repeatedly folded, bent, and/or rolled.

A touch sensor according to an exemplary embodiment may include: a touch substrate; a plurality of first touch electrodes extending in a first direction; a plurality of second touch electrodes extending in a second direction crossing the first direction; and a plurality of minute protrusions on at least one of the plurality of first and second touch electrodes, wherein the plurality of first and second touch electrodes are formed on the same surface of the touch substrate, or are formed on different surfaces of the touch substrate, each of the first and second touch electrodes comprises a first surface facing the touch substrate and a second surface located on the opposite side of the first surface, and the plurality of minute protrusions are formed on the second surface.

The plurality of minute protrusions may each have a cilia shape.

The plurality of minute protrusions are inclined at a set angle relative to the touch substrate.

The ends of the minute protrusions are divided into a plurality of strands.

The plurality of first and second touch electrodes are formed on the same surface of the touch substrate, the plurality of first touch electrodes extend in the first direction and are spaced from each other, and the plurality of second touch electrodes extend in the second direction and are spaced from each other and do not overlap the plurality of first touch electrodes.

The plurality of first and second touch electrodes are on the same layer.

A pair of adjacent first touch electrodes of the plurality of first touch electrodes are connected by a first connection portion, and a pair of adjacent second touch electrodes of the plurality of second touch electrodes are connected by a second connection portion crossing the first connection portion.

The first connection portion is positioned on the same layer as the plurality of first touch electrodes.

The first connection portion is integrally provided with the pair of adjacent first touch electrodes.

The second connection portion is positioned on a layer different from the plurality of second touch electrodes.

An insulating layer between first and second connection portions, and insulating the first and second connection portions.

A plurality of minute protrusions formed on an upper surface of the second connection portion.

The plurality of first and second touch electrodes are on different surfaces of the touch substrate, and the plurality of first and second touch electrodes cross each other.

The plurality of first and second touch electrodes include: a metal nanowire, a metal mesh, carbon nanotubes, graphene, ITO, and/or IZO.

The touch sensor may further include first and second touch wirings respectively connected to the first and second touch electrodes.

The touch sensor may further include a touch driver on the touch substrate and connected to the first and second touch wiring.

A display device may include: a display panel including a plurality of pixels; a touch panel on the display panel and configured to sense contact by an external object; and a cover window on the touch panel, wherein the touch panel includes: a touch substrate on the display panel; a plurality of first and second touch electrodes on the same surface or different surfaces of the touch substrate; and a plurality of minute protrusions on at least one of surfaces of the first and second touch electrodes, wherein the plurality of first electrodes extend in a first direction and the plurality of second touch electrodes extend in a second direction crossing the first direction, each of the first and second touch electrodes comprises a first surface facing the touch substrate and a second surface located on the opposite side of the first surface, and the plurality of minute protrusions are formed on the second surface.

The plurality of minute protrusions have a cilia shape.

The plurality of minute protrusions are inclined at a set angle relative to the touch substrate.

The ends of the minute protrusions are divided into a plurality of strands.

The plurality of first and second touch electrodes are between the touch substrate and the cover window, and the first and second touch electrodes are connected with the cover window by the plurality of minute protrusions.

The plurality of first and second touch electrodes are on the same layer, the plurality of first touch electrodes extend in the first direction and are spaced from each other, and the plurality of second touch electrodes extend in the second direction and are spaced from each other and do not overlap the plurality of first touch electrodes.

A pair of adjacent first touch electrodes of the plurality of first touch electrodes are connected to each other by a first connection portion with the same layer as the plurality of first touch electrodes, and the first connection portion is integrally provided with the pair of adjacent first touch electrodes, and a pair of adjacent second touch electrodes of the plurality of second touch electrodes are connected by a second connection portion with a layer different from the plurality of second touch electrodes, and crosses the first connection portion.

The display device may further include an insulating layer between first and second connection portions, and insulating the first and second connection portions.

The display device may further include a plurality of minute protrusions formed on an upper surface of the second connection portion.

The plurality of first touch electrodes are between the touch substrate and the cover window, and are connected with the cover window by the plurality of minute protrusions, and the plurality of second touch electrodes are between the touch substrate and the display panel, and are connected with the display panel by the plurality of minute protrusions.

A method for manufacturing a touch sensor may include: forming a plurality of first and second touch electrodes on a same surface or different surfaces of a touch substrate; forming a first mask pattern on the first and second touch electrodes; and forming a plurality of minute protrusion on at least one of the first and second touch electrodes, respectively, by utilizing the first mask pattern.

The forming of the first mask pattern includes: forming a photosensitive film on the first and second touch electrodes; and exposing and developing the photosensitive film.

The forming of the first mask pattern includes: forming a same mask pattern as the first mask pattern to be formed on the first and second touch electrodes on a mask mold; and transferring the mask pattern from the mask mold onto the first and second touch electrodes.

In forming of the plurality of minute protrusions, the first and second touch electrodes are etched to form the plurality of minute protrusions by utilizing the first mask pattern as an etching mask.

The forming of the plurality of first and second touch electrodes includes: forming a conductive layer on the touch substrate; forming a second mask pattern on the conductive layer; and patterning the conductive layer into the first and second touch electrodes by using the second mask pattern.

The plurality of first and second electrodes includes: a metal nanowire, a metal mesh, carbon nanotubes, graphene, ITO, and/or IZO.

DETAILED DESCRIPTION

Hereinafter, exemplary embodiments will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit to those skilled in the art.

A touch sensor according to an exemplary embodiment will be described with reference to FIG. 1 to FIG. 5.

Figure 1:
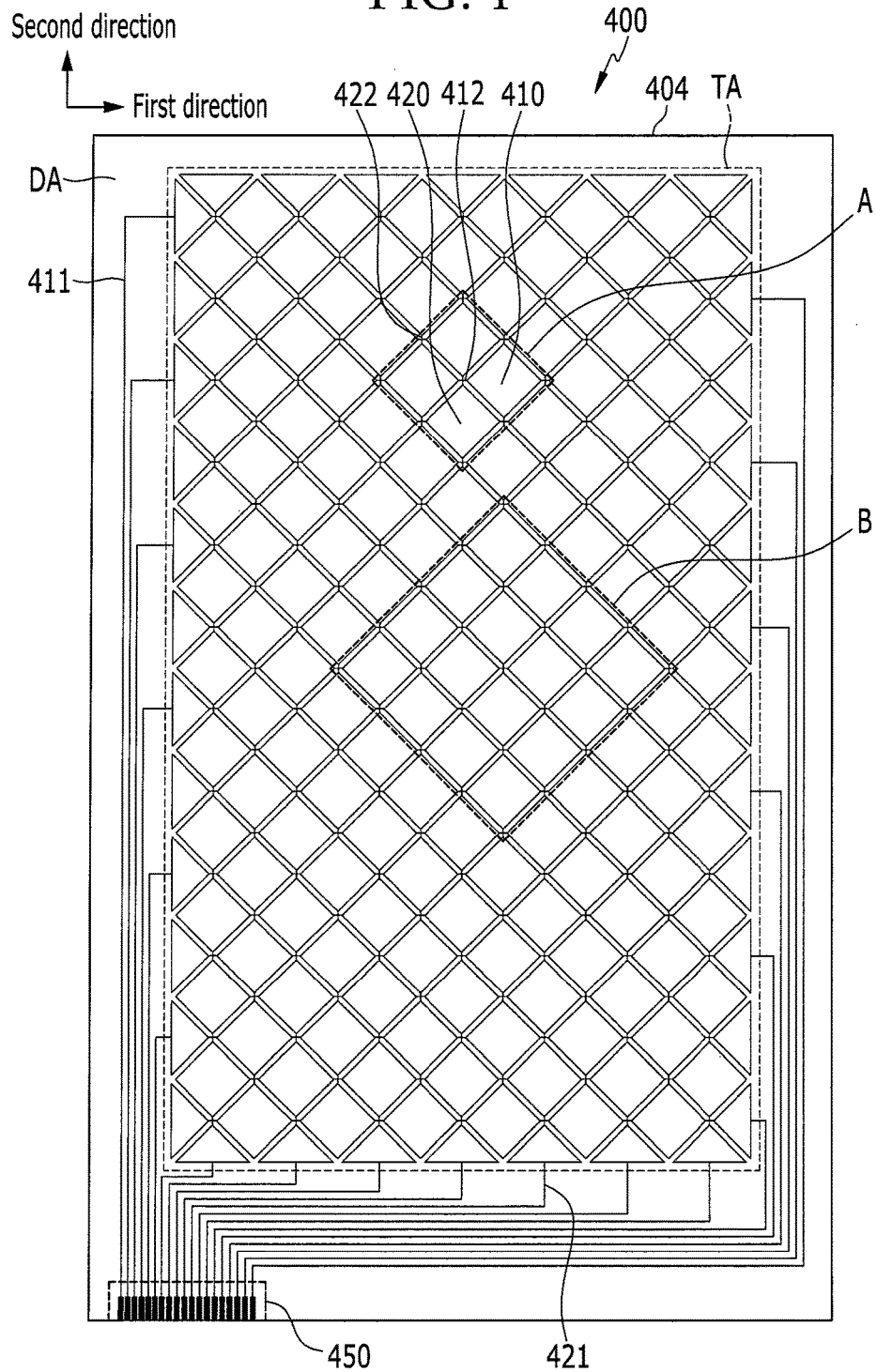
FIG. 1 is a top plan view of a touch sensor according to an exemplary embodiment of the present invention.
Figure 2:
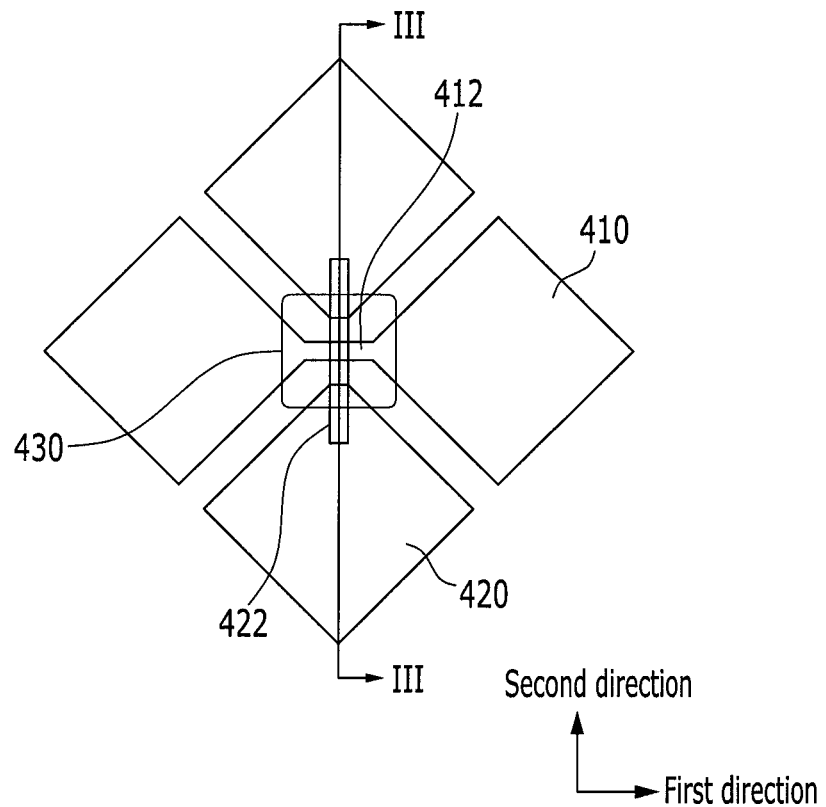
FIG. 2 is an enlarged view of an area A of the touch sensor of FIG. 1.
Figure 3:
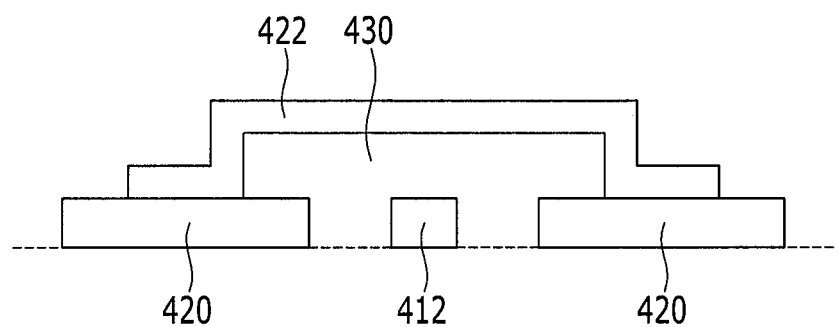
FIG. 3 is a cross-sectional view of the touch sensor of FIG. 2 taken along a line III-III.
Figure 4:
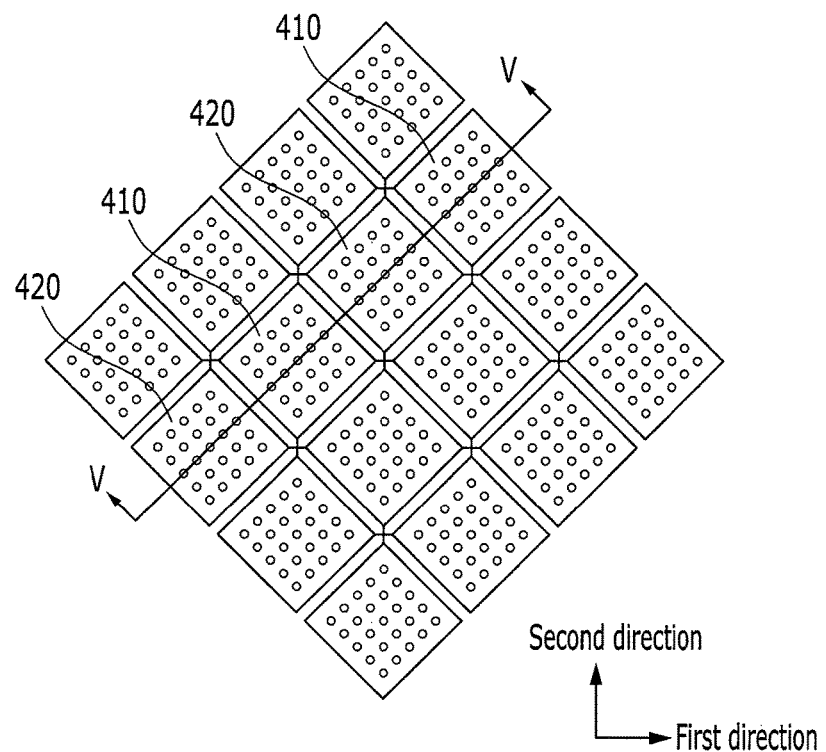
FIG. 4 is an enlarged view of an area B of the touch sensor of FIG. 1.
Figure 5:
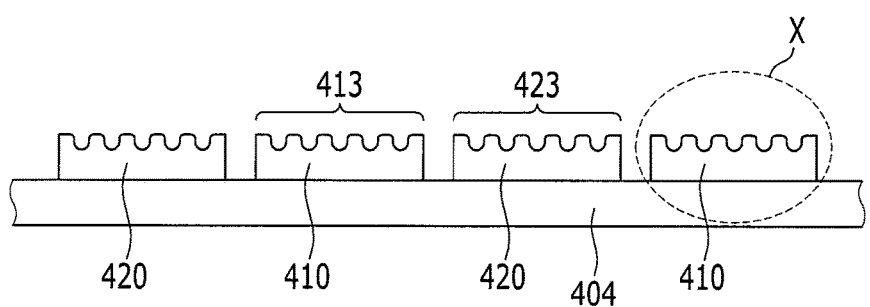
FIG. 5 is a cross-sectional view of the touch sensor of FIG. 4 taken along a line V-V.

FIG. 1 is a top plan view of a touch sensor according to an exemplary embodiment of the present invention, FIG. 2 is an enlarged view of an area A of the touch sensor of FIG. 1, FIG. 3 is a cross-sectional view of the touch sensor of FIG. 2 taken along a line III-III, FIG. 4 is an enlarged view of an area B of the touch sensor of FIG. 1, and FIG. 5 is a cross-sectional view of the touch sensor of FIG. 4 taken along a line V-V.

Referring to FIG. 1, the touch sensor 400 according to an exemplary embodiment includes a touch substrate 404, first and second touch electrodes 410 and 420, first and second connection portions 412 and 422, and first and second touch wiring 411 and 421.

In this case, the touch sensor device 400 according to the exemplary embodiment includes a touch sensing area TA for detecting a touch, and a peripheral area PA surrounding the touch sensing area TA. The non-sensing area DA is referred to as a dead space.

The touch substrate 404 may be a flexible film, however it is not limited thereto. For example, the touch substrate 404 may alternatively, be a rigid substrate including glass, plastic, etc. The touch substrate 404 may be an isotropic substrate, and a phase retardation value thereof may be substantially zero or very low. The touch substrate 404 may include at least one of an isotropic cyclic olefin polymer (COP) film, an unstretched polycarbonate (PC) film, and/or a triacetyl cellulose (TAC) film as the isotropic film.

In this case, the plurality of first and second touch electrodes 410 and 420 may be mainly positioned in the touch sensing area TA, and the first and second touch wiring 411 and 421 may be positioned in the touch sensing area TA and/or in the non-sensing area DA.

The first and second touch electrodes 410 and 420 may have transmittance of more than a set or predetermined value to transmit light from the underlying display panel. For example, the first and second touch electrodes 410 and 420 may include at least one transparent conductive material selected from a metal nano wire, a conductive polymer such as PEDOT, a metal mesh, carbon nanotubes (CNT), indium tin oxide (ITO), indium zinc oxide (IZO), and a thin metal layer.

The first and second touch wiring 411 and 421 may include the transparent conductive material included in the touch electrodes 410 and 420 and/or a low resistance material (such as molybdenum (Mo), silver (Ag), titanium (Ti), copper (Cu), aluminum (Al), or molybdenum/aluminum/molybdenum (Mo/Al/Mo)).

The first and second touch wiring 411 and 421 may include a portion that is positioned at the same layer as the first and second touch electrodes 410 and 420, or it may not be on the same layer as the first and second touch electrodes 410 and 420.

The first and second touch electrodes 410 and 420 form a touch sensor that may sense the contact by various methods. The touch sensor may be a touch sensor using various methods such as a resistive type (kind), a capacitive type (kind), an electromagnetic (EM) type (kind), and an optical type (kind). The present exemplary embodiment will be described using the capacitive type of touch sensor by way of example; however it is not limited thereto.

The capacitive type of touch sensor may receive a sensing input signal from a touch driver by one of the touch electrodes 410 and 420, and may output a sensing output signal that changes depending on the contact of the external object.

When the touch electrodes 410 and 420 form a self-sensing capacitor with a foreign object, the touch electrode receives the sensing input signal and is charged with a set or predetermined amount of charge. When a foreign object such as a finger, make contact with the self-sensing capacitor, the stored charge is changed and a sensing output signal, which is different from the input sensing input signal, is output. Contact information such as a contact state or a contact position may be determined by the change in the sensing output signal.

When neighboring touch electrodes 410 and 420 form a mutual-sensing capacitor, one touch electrode receives the sensing input signal from the driver and the self-sensing capacitor is charged with a set or predetermined amount of charge. When a foreign object such as a finger, make contact with the self-sensing capacitor, the stored charge of the self-sensing capacitor is changed and the changed amount of charge is output as a sensing output signal through the touch electrodes 410 and 420. The contact information such as a contact state or a contact position may be determined by the sensing output signal.

The touch sensor forming the mutual-sensing capacitor will be described in the present exemplary embodiment as an example, but is not limited thereto.

Referring to FIG. 1, the touch electrodes 410 and 420 of the touch sensor according to an exemplary embodiment may include a plurality of first touch electrodes 410 and a plurality of second touch electrodes 420. The first touch electrode 410 and the second touch electrode 420 are separated (or spaced) from each other.

The plurality of first touch electrodes 410 and the plurality of second touch electrodes 420 may be alternately dispersed and disposed, so as to not overlap each other in the touch active area TA. The plurality of first touch electrodes 410 may be disposed along a column direction and a row direction, and the plurality of second touch electrodes 420 may also be disposed along a column direction and a row direction.

The first touch electrode 410 and the second touch electrode 420 may be disposed on or at the same layer; however, it is not limited thereto, and the first touch electrode 410 and the second touch electrode 420 may be positioned at or in different layers. When the first touch electrode 410 and the second touch electrode 420 are positioned at different layers, the first touch electrode 410 and the second touch electrode 420 may be positioned at difference surfaces from each touch substrate 404, and may be positioned at different layers on the same surface of the touch substrate 404.

According to an exemplary embodiment of the present invention, the plurality of first and second touch electrodes 410 and 420 are positioned on the upper surface of the touch substrate 404. That is, as shown in FIG. 1, the first and second touch electrodes 410 and 420 are formed in the same surface as the touch substrate 404.

Each of the first touch electrode 410 and the second touch electrode 420 may have shape of a quadrangle, but they are not limited thereto, and they may have various forms, such as a form having a protrusion, in order to improve sensitivity of the touch detecting sensor.

The plurality of first touch electrodes 410 arranged in the same row or column may be connected with or separated from each other inside or outside the touch sensing area TA. Similarly, at least some of the plurality of second touch electrodes 420 arranged in the same column or row may be connected with or separated from each other inside and/or outside the touch sensing area TA.

For example, in a case where the plurality of first touch electrodes 410 arranged in the same row, that is, a first direction, are connected with each other inside the touch sensing area TA as illustrated in FIG. 1, the plurality of second touch electrodes 420 arranged in the same column, that is, a second direction, may be connected with each other inside the touch sensing area TA. Here, the second direction, which is perpendicular to the first direction, is the same direction as the column direction.

More particularly, the plurality of first touch electrodes 410 positioned in each row may be connected with each other through a first connection part 412, and the plurality of second touch electrodes 420 positioned in each column may be connected with each other through a second connection part 422.

Referring to FIG. 2 and FIG. 3, the first connection part 412 connecting the adjacent first touch electrodes 410 may be positioned on the same layer as that of the first touch electrode 410 and formed of the same material as that of the first touch electrode 410. That is, the first touch electrode 410 and the first connection part 412 may be integrated with each other, and may be concurrently or simultaneously patterned.

The second connection part 422 connecting the adjacent second touch electrodes 420 may be positioned on a different layer from that of the second touch electrode 420. That is, the second touch electrode 420 and the first connection part 412 may be separated from each other, and may be separately patterned. The second touch electrode 420 and the second connection part 422 may be connected with each other through direct contact.

An insulating layer 430 is positioned between the first connection part 412 and the second connection part 422 to insulate the first connection part 412 and the second connection part 422 from each other. The insulating layers 430 may be a plurality of separated island-shaped insulators disposed at every crossing portion of the first connection part 412 and the second connection part 422 as illustrated in FIG. 2 and FIG. 3. The insulating layer 430 may expose at least a part of the second touch electrode 420 so that the second connection part 422 is connectable with the second touch electrode 420.

According to another exemplary embodiment of the present invention, the insulating layer 430 is formed on the entire area of the touch substrate 404, and the insulating layer 430 positioned on the portion of the second touch electrode 420 may be removed for the connection of the second touch electrodes 420 in the adjacent column direction.

Differently from FIG. 2 and FIG. 3, a second connection part 422 connecting the adjacent second touch electrodes 420 may be positioned on the same layer as that of a first touch electrode 410 and integrated with the first touch electrode 410, and a first connection part 412 connecting adjacent first touch electrodes 410 may be positioned on a different layer from that of the first touch electrode 410.

Referring to FIG. 1, the first touch electrodes 410 connected with each other in each row may be connected with the touch controller through a first touch wiring 411, and the second touch electrodes 420 connected with each other in each column may be connected with the touch driver through a second touch wiring 421. The first touch wiring 411 and the second touch wiring 421 may be positioned in the non-sensing area DA, and/or alternatively may be positioned in the touch sensing area TA.

End portions of the first touch wiring 411 and the second touch wiring 421 form a pad portion 450 in the non-sensing area DA of the touch sensor unit 400.

The first touch wiring 411 inputs the sensing input signal to the first touch electrode 410 or outputs the sensing output signal to the touch driver through the pad portion 450. The second touch wiring 421 inputs the sensing input signal to the second touch electrode 420 and outputs the sensing output signal through the pad portion 450.

The touch driver controls the operation of the touch sensor. The touch driver may transmit the sensing input signal to the touch sensor and may receive a sensing output signal to be processed. The touch driver processes the sensing output signal to generate the touch information such as the touch and the touch position.

The touch driver may be directly mounted on the touch sensor 400 in at least one IC chip, may be mounted on a flexible printed circuit film (FPC) and/or a printed circuit board to be attached to the touch sensor 400 as a tape carrier package (TCP), and/or may be mounted on a separate printed circuit board to be connected to the pad portion 450. Alternatively, the touch driver may be integrated with the touch sensor 400.

The first touch electrode 410 and the second touch electrode 420 adjacent to each other may form the mutual sensing capacitor serving as the touch sensor. The mutual sensing capacitor may receive the sensing input signal through one of the first touch electrode 410 and the second touch electrode 420, and may output the change in the charge amount due to contact by the external object, as the sensing output signal to the rest of the touch electrodes.

Differently from FIG. 1 to FIG. 3, a plurality of first touch electrodes 410 and a plurality of second touch electrodes 420 may be separated from each other and may be respectively connected to the touch driver through the touch wiring. In this case, the touch electrodes 410 and 420 may form the self-sensing capacitor as the touch sensor. The self-sensing capacitor receives the sensing input signal to be charged by a set or predetermined charge amount, and may output a sensing output signal that is different from the sensing input signal which is input due to a change in the charged charge amount generated when the external object, such as a finger, makes contact.

Referring to FIG. 4 and FIG. 5, a plurality of minute protrusions are formed on the upper surface of the first and second touch electrodes 410 and 420. In more detail, a plurality of first minute protrusions 413 are formed on the upper surface of the first touch electrode 410, and a plurality of second minute protrusions 423 are formed on the upper surface of the second touch electrode 420. The first and second minute protrusions 413 and 423 may combine the first and second touch electrodes 410 and 420 and other constitutions positioned on the touch sensor 400. For example, the minute protrusions 413 and 423 combine the first and second touch electrodes 410 and 420 and a polarizer 500, which will be described layer.

According to an exemplary embodiment of the present invention, the first and second minute protrusions 413 and 423 may be made with the same or similar shape as a minute cilia shape formed on sole (foot) of a Gecko lizard. The minute cilia shape formed in the sole of the Gecko lizard may provide strong adherence by a van der Waals bond, as known by those skilled in the art. A van der Waals bond follows a principle that when two atoms approach close to each other, variations are generated in the electron cloud surrounding the nucleus of each atom, such that a weak static electricity attraction is generated to have adherence for two atoms. The static electricity attraction between the two atoms is weak, however, if there are a plurality of cilia shapes and the ends of each cilia are cracked (e.g., split), the attraction strength by each cilia is gathered (or combined), thereby increasing the force thereof. Also, the minute cilia may be disposed such that they are inclined at a set or predetermined angle. As such, directional adhesion for easily separating the adhered object may also be provided.

Figure 6:
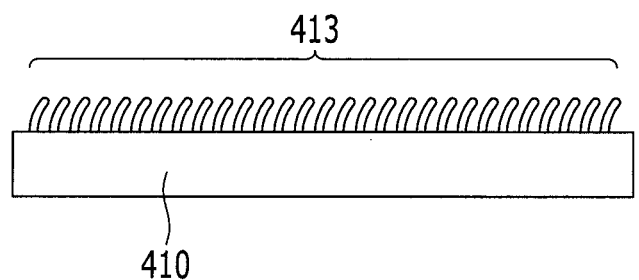
FIG. 6 is an enlarged view of an area X of the touch sensor of FIG. 5.
Figure 7:
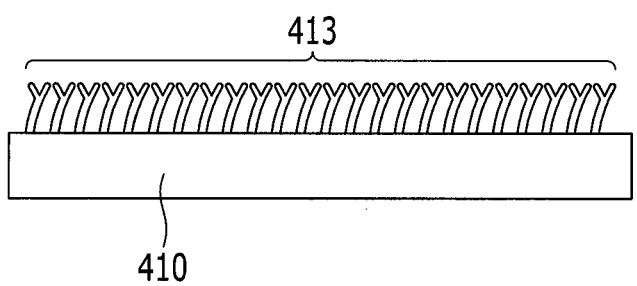
FIG. 7 is an enlarged view of an area X of the touch sensor of FIG. 5.

Referring to FIG. 6 and FIG. 7, the first and second minute protrusions 413 and 423 may be formed of the cilia shape. In more detail, each end of the first and second minute protrusions 413 and 423 may be formed of the shape such that it can be further divided into a plurality of strands. Also, the plurality of first and second minute protrusions 413 and 423 may be disposed to be inclined at a set or predetermined angle with respect to the touch substrate 404.

As described above, if the plurality of first and second minute protrusions 413 and 423 are formed according to the above-described shape, static electricity attraction by the van der Waals bond is gathered, thereby generating large adherence. Accordingly, by the plurality of first and second minute protrusions 413 and 423, the first and second touch electrodes 410 and 420 and the other elements, for example, the polarizer 500 (shown in FIG. 10), may be combined. That is, the first and second touch electrodes 410 and 420 and the polarizer 500 may be combined without utilizing a separate adhesive. Also, during the manufacturing process, when the touch sensor 400 and the polarizer 500 are incorrectly attached, the touch sensor 400 and the polarizer 500 may be easily separated when separating them.

On the other hand, the minute protrusions may also be formed on the upper surface of the second connection portion 422. As described above, the second connection portion 422 is formed with the different layer from the second touch electrode 420 such that the second touch electrode 420 may protrude upwardly, thereby the second connection portion 422 may be connected with the above-described polarizer 500. Accordingly, if a plurality of third minute protrusions are formed on the upper surface of the second connection portion 422, the above described polarizer 500 may be firmly adhered.

Figure 8:
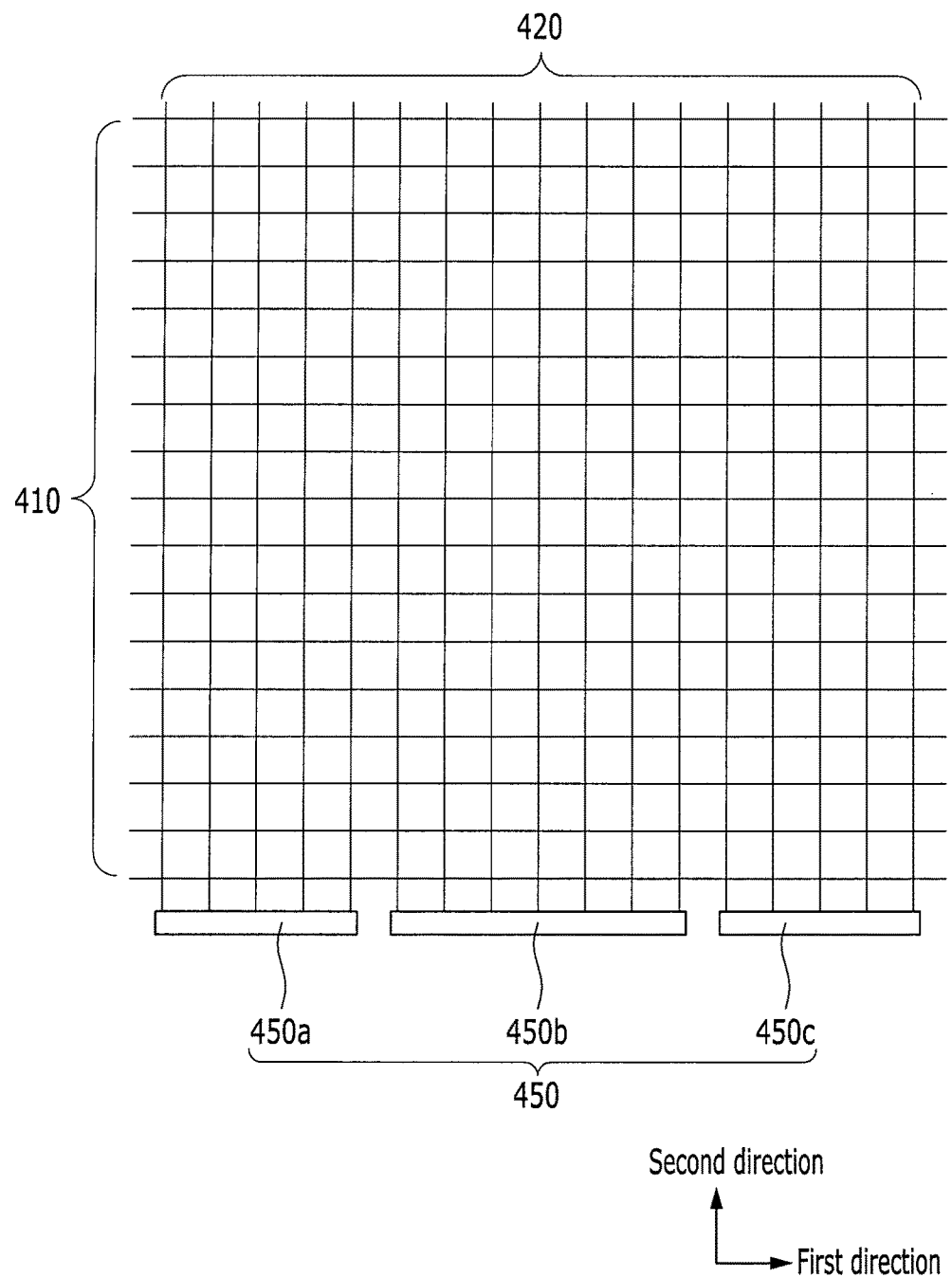
FIG. 8 is a top plan view of a touch sensor according to another exemplary embodiment of the present invention.

According to another exemplary embodiment of the present invention, the plurality of first and second touch electrodes 410 and 420 may be positioned on different surfaces of the touch substrate 404. That is, as shown in FIG. 8 and FIG. 9, the plurality of first and second touch electrodes 410 and 420 may be disposed on the upper surface and the lower surface of the touch substrate 404, respectively.

The first touch electrode 410 may be positioned on the upper surface of the touch substrate 404 and may extend in the first direction. Differently from the first touch electrode 410 shown in FIG. 1, the first touch electrode 410 may be formed of a bar shape. On the other hand, the second touch electrode 420 may be positioned on the lower surface of the touch substrate 404 and may extend in the second direction crossing or perpendicular to the first direction. Like the first touch electrode 410, the second touch electrode 420 may be formed of the bar shape.

In this case, the first and second touch electrodes 410 and 420 may crossed each other with the touch substrate 404 interposed therebetween.

Figure 9:
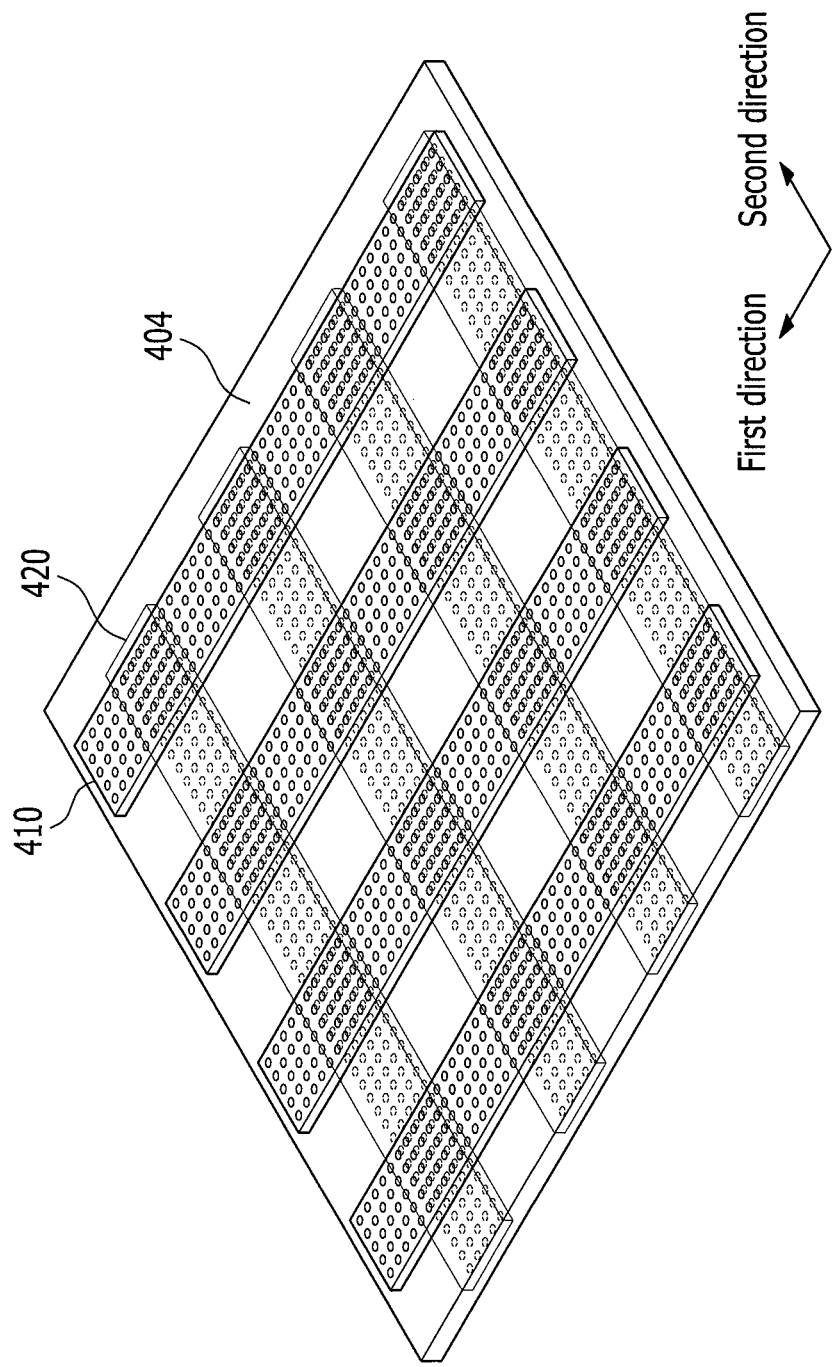
FIG. 9 is a schematic perspective view of the touch sensor of FIG. 8.

Referring to FIG. 9, a plurality of first and second minute protrusions are formed on the upper surface of the first and second touch electrodes 410 and 420, respectively. According to another exemplary embodiment of the present invention, as the first and second touch electrodes 410 and 420 are disposed on the different surfaces of the touch substrate 404, the plurality of first and second minute protrusions are formed on the different surfaces with respect to the touch substrate 404.

Accordingly, in the above-described exemplary embodiment of the present invention, the first and second minute protrusions 413 and 423 are formed on the same surface, thereby providing the adherence to one surface with respect to the touch substrate 404, for example, the upper surface. In contrast, according to another exemplary embodiment of the present invention, the first and second minute protrusions are formed on the different surfaces, thereby concurrently or simultaneously providing the adherence to both surfaces with respect to the touch substrate 404, for example, the upper surface and the lower surface.

As described above, if the plurality of minute protrusions 413 and 423 are formed on the upper surface of the touch electrodes 410 and 420 formed on the touch substrate 404, when adhering other constituent elements, such as the polarizer 500, in the display device (which will be described later), a separate adhesive or a pressure-sensitive adhesive is not required. Thus, the thickness of the touch sensor 400 may be reduced compared to the conventional sensor or related art, and the thickness of the display device including the touch sensor 400 may be reduced.

Accordingly, the flexibility of the display device that can be folded, bent, or rolled, may be further increased and the thickness of the touch sensor 400 becomes thinner such that the optical characteristics, such as the transmittance of the image displayed by the display device including the touch sensor, may be improved.

Also, the first and second minute protrusions 413 and 423 formed on the touch electrodes 410 and 420 may provide the strong adherence when folding, rolling, and/or bending the display device, and the touch sensor and the display panel, and/or the touch sensor and the polarizer may be prevented from being separated from each other.

On the other hand, by the first and second minute protrusions 413 and 423 that are inclined at the set or predetermined angle, when incorrectly adhering the touch sensor and the polarizer during the manufacturing process of the display device, the touch sensor and the polarizer may be easily separated, and they may be again adhered such that the cost may be reduced and the manufacturing process may be simplified.

Next, the display device including the touch sensor according to the present exemplary embodiment will be described with reference to FIG. 10 as well as FIG. 1 to FIG. 9. When describing the display device including the touch sensor according to an exemplary embodiment of the present invention, the detailed description of the same elements as in the above-described touch sensor is omitted.

Figure 10:
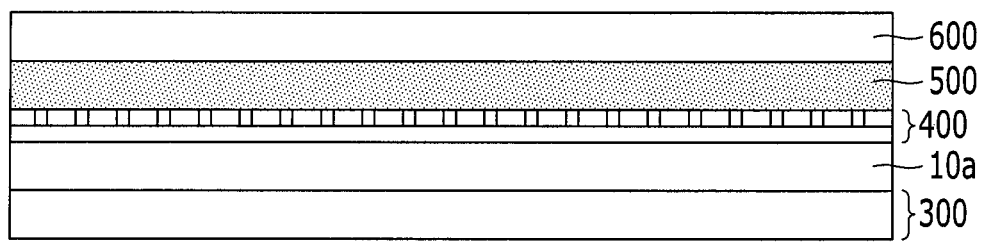
FIG. 10 is a cross-sectional view of a display device including a touch sensor according to an exemplary embodiment of the present invention.

FIG. 10 is a cross-sectional view of a display device including a touch sensor according to an exemplary embodiment of the present invention.

Referring to FIG. 10, the display device according to an exemplary embodiment includes the display panel 300, the touch panel 400, the polarizer 500, and a cover window 600.

The display panel 300 includes a display area DA as an area displaying the image, and a peripheral area PA surrounding the display area DA. In the exemplary embodiment shown in FIG. 10, the display panel 300 may display the image in the upward direction.

In the display area DA, the plurality of pixels PX and the plurality of display signal lines connected to the pixels PX and transmitting the driving signals are positioned.

The display signal lines include a plurality of gate signal lines transmitting the gate signal and a plurality of data lines transmitting the data signal. The gate signal lines and the data lines may cross each other. The display signal lines may extend in the peripheral area PA to form the pad portion.

The plurality of pixels PX may be arranged in an approximate matrix shape, but are not limited thereto. Each pixel PX may include at least one switching element connected to the gate line and the data line, and at least one pixel electrode connected thereto. The switching element may be a three-terminal element such as a thin film transistor integrated in the display panel 300. The switching element is turned on or turned off depending on the gate signal transmitted by the gate line, to transmit the data signal transmitted by the data line to the pixel electrode. The pixel PX may further include the pixel electrode and the common electrode facing the pixel electrode. The common electrode may transmit the common voltage. The pixel PX may display an image of desired luminance depending on the data voltage applied to the pixel electrode.

In a case of the organic light emitting device, an emission layer is positioned between the pixel electrode and the common electrode, thereby forming a light-emitting device.

In order to implement a color display, each pixel PX may display one of the primary colors, and a desired color is recognized with a sum of the primary colors. Examples of the primary colors may include three primary colors, such as red, green, and blue, or four primary colors. Each pixel PX may further include a color filter positioned at a place corresponding to each pixel electrode and showing one of the primary colors, and the emission layer included in the light emitting diode may emit a colored light.

In some embodiments, the touch panel 400 is positioned on the display panel 300.

The touch panel 400 may be attached on the display panel 300 through an adhesive 10a such as an OCA (optically clear adhesive), an OCR (optically clear resin), and/or a PSA (pressure sensitive adhesive). However, in the touch panel 400, the first and second touch electrodes 410 and 420 are formed on the upper surface and the lower surface with respect to the described touch substrate 404 and the plurality of first and second minute protrusions 413 and 423 formed on the first and second touch electrodes 410 and 420, thereby omitting the adhesive 10a. That is, by the first and second minute protrusions 413 and 423 formed in the touch electrode 410 and 420, the touch panel 400 and the display panel 300 may be combined.

The touch panel 400 may sense the contact by an external object. Here, the touch includes a hovering touch where the external object approaches the display device or moves while approaching the display device, in addition to the case where an external object such as a user's hand directly contacts the display device.

As described above, the touch panel 400 includes a touch substrate 404, first and second touch electrodes 410 and 420, first and second connection portions 412 and 422, and first and second touch wiring 411 and 421.

According to an exemplary embodiment of the present invention, the first and second touch electrodes 410 and 420, as shown in FIG. 1, may be formed on the same surface of the touch substrate 404, as shown in FIG. 9, may be formed on the upper surface and the lower surface that are the different surfaces of the touch substrate 404.

In some embodiments, the first and second touch electrodes 410 and 420 are formed with the plurality of minute protrusions having the cilia shape. A plurality of first minute protrusions 413 are formed on the upper surface of the first touch electrode 410, and a plurality of second minute protrusion 423 are formed on the upper surface of the second touch electrode 420. The first and second minute protrusions 413 and 423 may combine the touch panel 400 and the other elements.

As described above, the first and second minute protrusions 413 and 423 may be formed of the same as or similar to the minute cilia shape formed on the sole (foot) of the Gecko lizard. The plurality of first and second minute protrusions 413 and 423 are formed in the above-described shape such that the static electricity attraction by van der Waals bond is gathered, thereby exhibiting the large adherence.

On the other hand, each end of the first and second minute protrusions 413 and 423 may be formed of the shape of a plurality of strands.

In some embodiments, the plurality of first and second minute protrusions 413 and 423 may be disposed to be inclined at the set or predetermined angle with respect to the touch substrate 404. If the plurality of first and second minute protrusions 413 and 423 are inclined at the set or predetermined angle, as described above, the directional adhesion for separating the adhered object may be provided.

As shown in FIG. 1, when the first and second touch electrodes 410 and 420 of the touch panel 400 are formed on the upper surface of the touch substrate 404, the polarizer 500 may be attached on the touch panel 400 without the adhesive. According to an exemplary embodiment of the present invention, since the first and second minute protrusions 413 and 423 formed in the first and second touch electrodes 410 and 420 provide the strong adherence, the polarizer 500 and the touch panel 400 may be combined without utilizing the above-described adhesive.

On the other hand, as shown in FIG. 9, when the first and second touch electrodes 410 and 420 are formed on the upper surface and the lower surface, respectively, which are different surfaces of the touch substrate 404, the adhesive 10a used to combine the touch panel 400 and the display panel 300 may be eliminated. As described above, by the plurality of second minute protrusions 423 formed on the second touch electrode 420 formed in the lower surface of the touch substrate 404, the touch panel 400 and the display panel 300 may be combined.

In some embodiments, the polarizer 500 may be formed of a flexible film. The polarizer 500 may include PVA (polyvinyl alcohol), and at least one supporting member may be adhered at both sides thereof. The supporting member may include TAC (triacetyl cellulose), CAP (cellulous acetate propionate), and/or WV-TAC (wide view-TAC). The adhesive may be formed at at least one surface of the polarizer 500.

The polarizer 500 may prevent external light that is reflected from the several electrodes and wiring included in the display panel 300 and the touch sensor device 400 positioned thereunder from being recognized by an observer.

That is, the light that is incident inside the display device passes through the polarizer 500, is reflected from the electrodes or the wiring thereunder, and is again incident to the polarizer 500 to generate destructive interference for the light that is just incident to the polarizer 500 such that the light may not be recognized from the outside of the display device.

The cover window 600 may be further positioned on the polarizer 500. The cover window 600 may be formed of an insulating material such as plastic or glass. The cover window 600 may be flexible or hard. The surface of the cover window 600 may be a touch surface of the display device with which the external object may be contacted.

The cover window 600 may be adhered on the polarizer 500 by utilizing adhesives such as OCA, OCR, and/or PSA.

Accordingly, in the display device according to an exemplary embodiment of the present invention, the first and second minute protrusions 413 and 423 are formed in the first and second touch electrodes 410 and 420, thereby providing the adherence to at least one of the upper surface and the lower surface with respect to the touch substrate 404.

As described above, if the plurality of minute protrusions 413 and 423 are formed on the upper surface or the lower surface of the touch electrodes 410 and 420 formed on the touch substrate 404, a separate adhesive may be omitted when adhering the touch panel 400 and the polarizer 500, or the touch panel 400 and the display panel 300, thereby reducing the thickness of the display device compared to the conventional art.

The flexibility of the display device that can be folded, bent, or rolled may be further increased and the thickness of the touch sensor 400 becomes thinner such that optical characteristics such as the transmittance of the image displayed by the display device including the touch sensor may be improved.

The first and second minute protrusions 413 and 423 formed on the touch electrode 410 and 420 may provide the strong adherence, such that when folding, rolling, or bending the display device, the touch sensor and the display panel or the touch sensor and the polarizer may be prevented from being separated from each other.

On the other hand, by the first and second minute protrusions 413 and 423 that are inclined at the set or predetermined angle, when incorrectly adhering the touch sensor and the polarizer in the manufacturing process of the display device, the touch sensor and the polarizer may be easily separated and they may be again adhered such that the cost may be reduced and the manufacturing process may be simplified.

Next, the manufacturing method of the touch sensor according to the present exemplary embodiment will be described with reference to FIG. 11 to FIG. 26 as well as FIG. 1 to FIG. 9. When describing the manufacturing method of the touch sensor according to an exemplary embodiment of the present invention, the detailed description of the same elements as in the above-described touch sensor is omitted.

Figure 23:
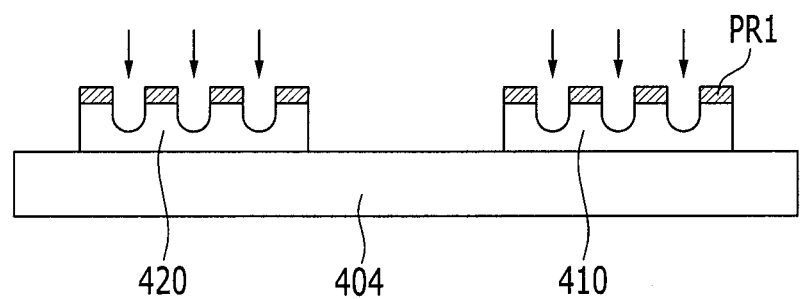
Figure 24:
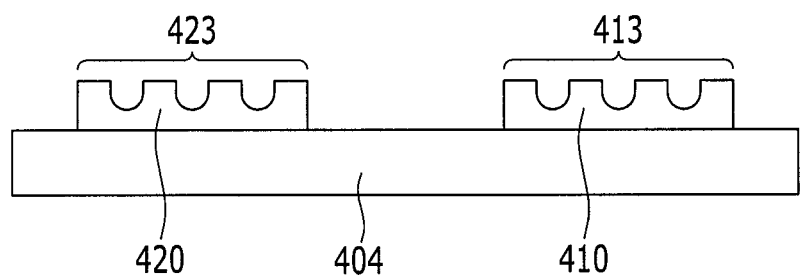
Figure 25:
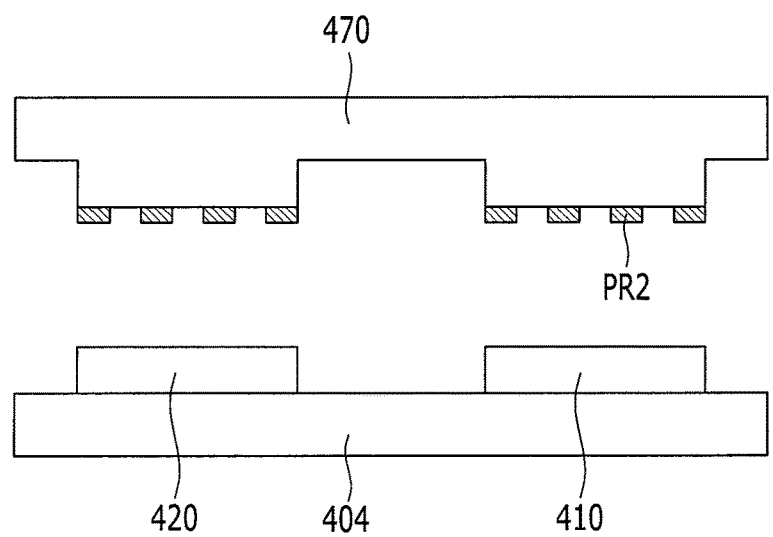
FIG. 25 and FIG. 26 are views sequentially showing another process of forming a minute protrusion in an upper surface of a touch electrode.
Figure 26:
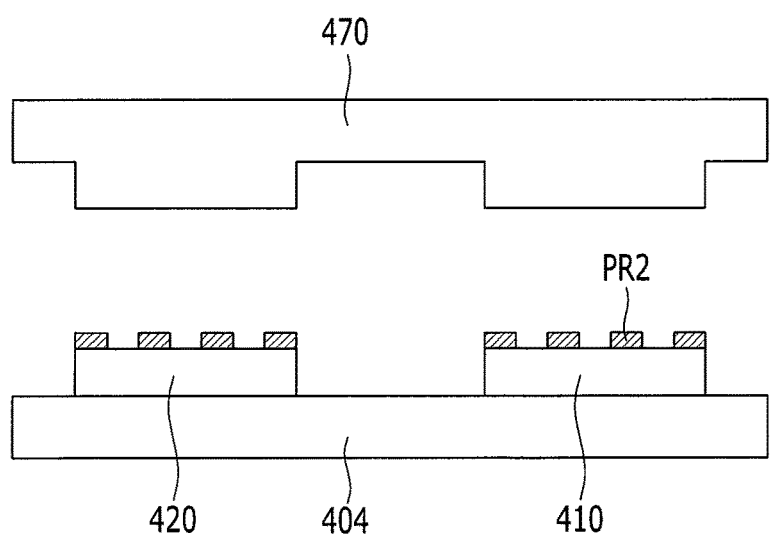

FIG. 11 to FIG. 19 are views sequentially showing a manufacturing process of a touch electrode of a touch sensor, FIG. 20 to FIG. 24 are views sequentially showing a process of forming a minute protrusion in an upper surface of a touch electrode, and FIG. 25 and FIG. 26 are views sequentially showing another process of forming a minute protrusion in an upper surface of a touch electrode.

First, a process of forming the first and second touch electrodes 410 and 420 on the touch substrate 404 will be described with reference to FIG. 11 to FIG. 19.

Figure 11:
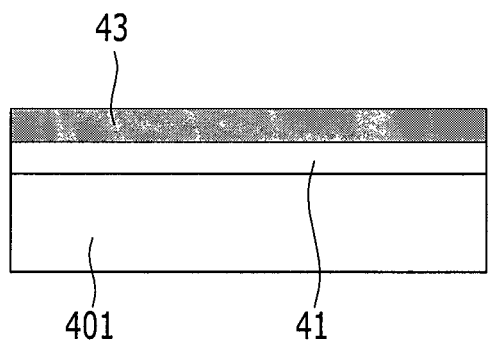
FIG. 11 to FIG. 19 are views sequentially showing a manufacturing process of a touch electrode of a touch sensor.

Referring to FIG. 11, a conductive layer is formed on a mother substrate 401 such as the cyclic olefin polymer (COP) film, the unstretched polycarbonate (PC) film, and/or the triacetyl cellulose (TAC) film. The conductive layer may include the first conductive layer 41 and the second conductive layer 43 that are sequentially deposited, but is not limited thereto.

In this case, the first conductive layer 41 may include the material forming the above described touch electrodes 410 and 420, for example, at least one of the transparent conductive materials such as the metal nanowire, the conductive polymer such as PEDOT, the metal mesh, the carbon nanotubes (CNT), ITO (indium tin oxide), IZO (indium zinc oxide), and the thin metal layer. The second conductive layer 43 may include the metal material such as aluminum (Al).

Figure 12:
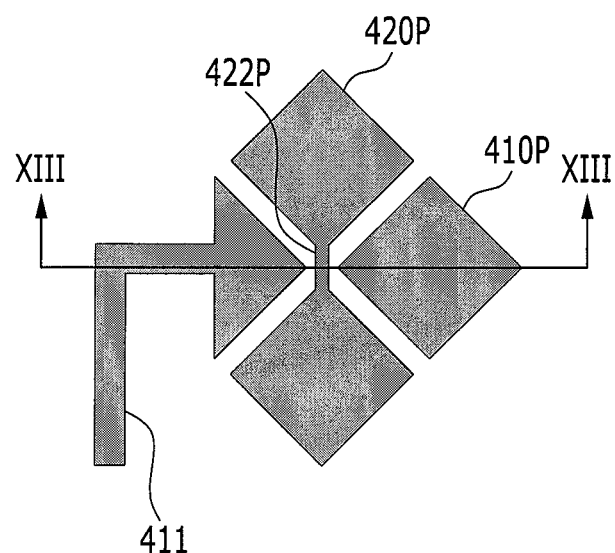
Figure 13:
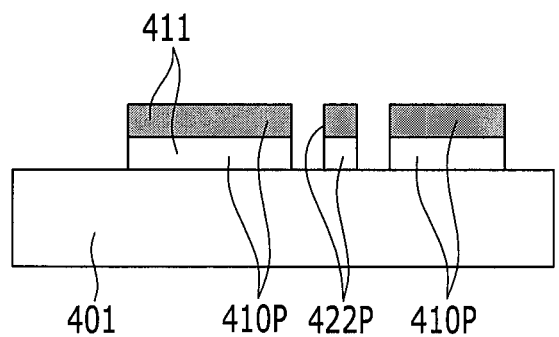

Next, referring to FIG. 12 and FIG. 13, the first conductive layer 41 and the second conductive layer 43 are patterned to form a first intermediate pattern 410P, a second intermediate pattern 420P, a second connection pattern 422P, and first touch wiring 411 and second touch wiring connected to the first intermediate pattern 410P and the second intermediate pattern 420P. The shape of the first intermediate pattern 410P and the second intermediate pattern 420P may be the same as that of the first touch electrode 410 and the second touch electrode 420 described above.

The second intermediate patterns 420P positioned in the same column may be connected with each other through the second connection patterns 422P positioned on the same layer as that of the second intermediate patterns 420P and patterned together with the second intermediate patterns 420P. Alternatively, the first intermediate patterns 410P positioned in the same row may be connected with each other through separate first connection patterns. However, differently from FIG. 12 and FIG. 13, the second intermediate pattern 420P may be connected to each other through a separate second connection pattern, and the first intermediate pattern 410P may be connected through the first connection pattern positioned on the same row.

Figure 14:
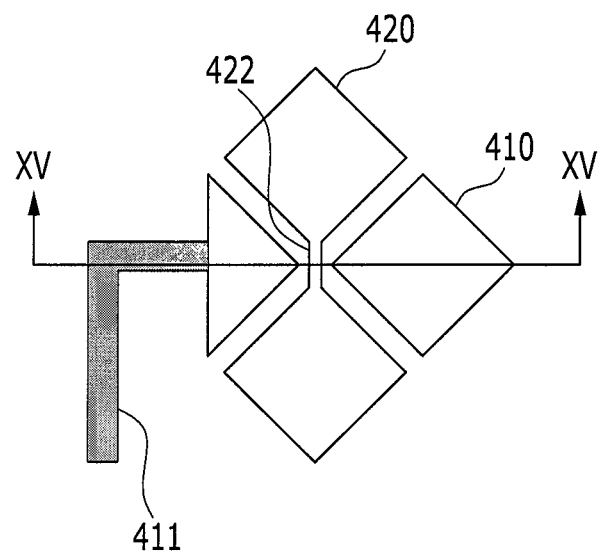
Figure 15:
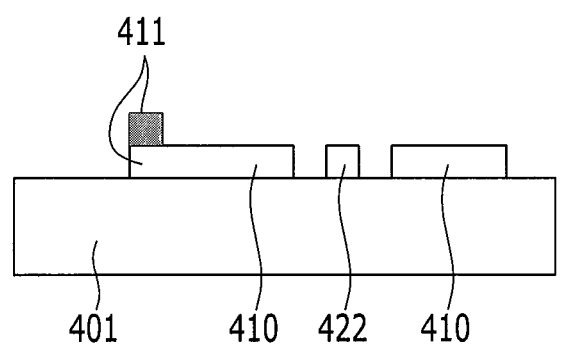

Next, referring to FIG. 14 and FIG. 15, a plurality of transparent touch electrodes 410, a plurality of transparent second touch electrodes 420, and a plurality of second connection parts 422 are formed by removing a second conductive layer 402, which is an upper layer of the first intermediate pattern 410P, the second intermediate pattern 420P, and the second connection pattern 422P, by an etching method and the like. Contrary to this, in a case where the first touch electrodes 410 arranged in the same column are connected through the first connection parts 412 positioned on the same layer, the first connection parts 412 may be formed instead of the second connection parts 422 in this step.

The first touch wiring 411 and the second touch wiring 421 may include the first conductive layer 41 and the second conductive layer 43 to form low resistance wires.

Figure 16:
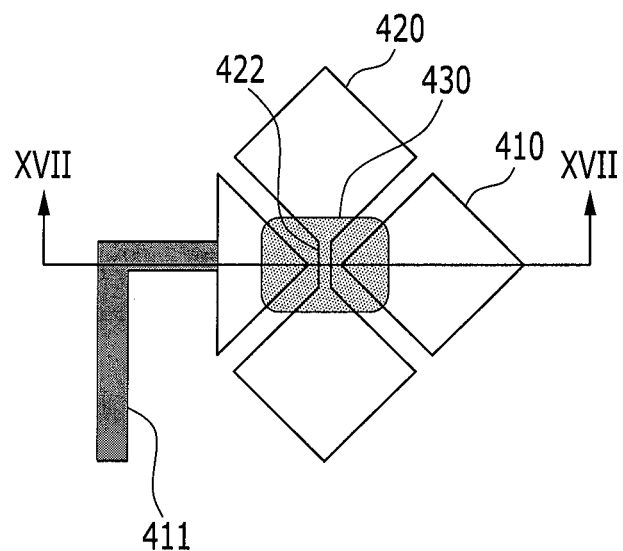
Figure 17:
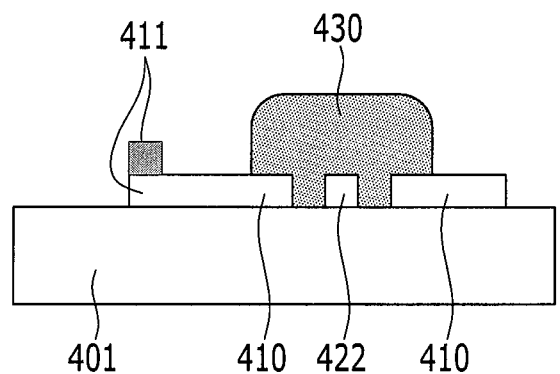

Next, referring to FIG. 16 and FIG. 17, an insulating material is deposited and patterned on the first touch electrode 410, the second touch electrode 420, the second connection portion 422, and the touch wiring to form an insulating layer 430 positioned on the second connection portion 422 and covering the second connection portion 422.

Figure 18:
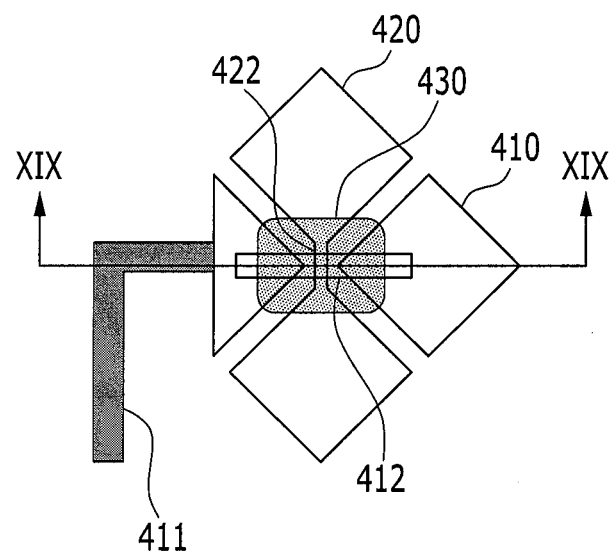
Figure 19:
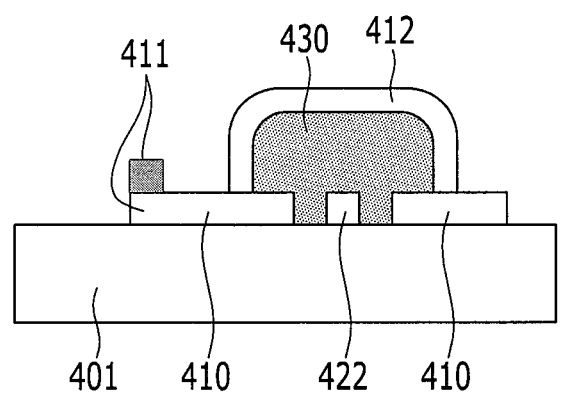

Next, referring to FIG. 18 and FIG. 19, the first connection part 412 insulated from and crossing the second connection part 422 and connecting the first touch electrodes 410, which are adjacent to each other in one row, is formed by stacking a conductive material on the insulating layer 430 and patterning the conductive material. Accordingly, the touch sensor including the first touch electrode 410 and the second touch electrode 420 is completed on the mother substrate 401.

As the process of forming the first and second touch electrodes 410 and 420, referring to FIG. 11 to FIG. 19, a method of forming the first and second touch electrodes 410 and 420 on the same surface of the mother substrate 401 will be described. However, the first conductive layer 41 and the second conductive layer 43 may be formed on different surfaces of the mother substrate 401, that is, the upper surface and the lower surface. However, differently from FIG. 11 to FIG. 19, the first intermediate pattern may be formed on the upper surface of the mother substrate 401, and the second intermediate pattern may be formed only on the lower surface of the mother substrate 401.

In this case, the first intermediate pattern may be formed of the first touch electrode 410 shown in FIG. 8 and FIG. 9, and the second intermediate pattern may be formed of the second touch electrode 420 shown in FIG. 8 and FIG. 9.

Next, referring to FIG. 20 to FIG. 24, the process of forming a plurality of minute protrusion on the first and second touch electrode 410 and 420 will be described.

Figure 20:
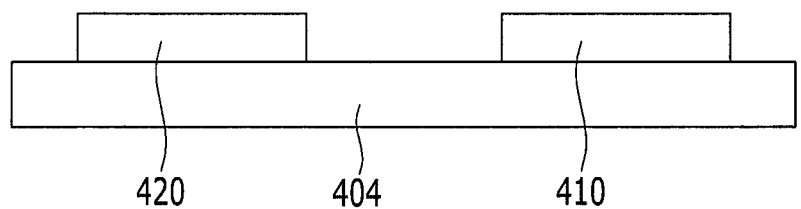
FIG. 20 to FIG. 24 are views sequentially showing a process of forming a minute protrusion in an upper surface of a touch electrode.
Figure 21:
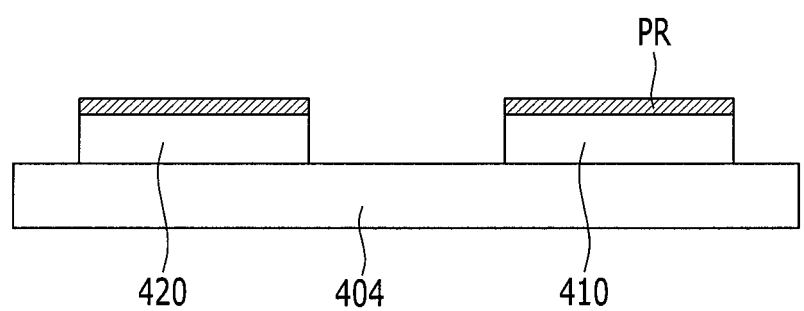
Figure 22:
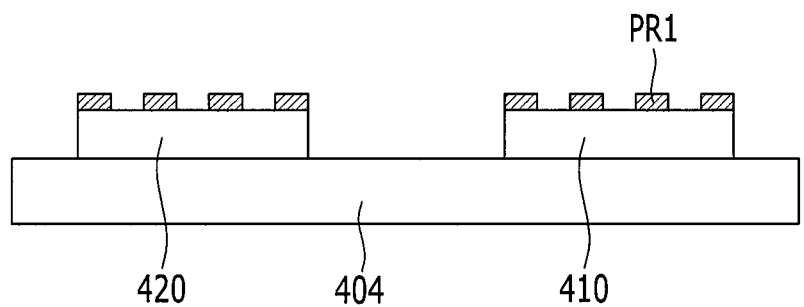

Referring to FIG. 20 to FIG. 22, a photoresist PR as a photosensitive material is formed on the first and second touch electrodes 410 and 420 formed by the above-described process. The photoresist PR is exposed and developed to form a first mask pattern PR1 on the first and second touch electrodes 410 and 420. The first mask pattern PR1 is formed of a pattern corresponding to the plurality of minute protrusions formed on the upper surface of the first and second touch electrode 410 and 420.

Referring to FIG. 23 and FIG. 24, the first and second minute protrusions 413 and 423 are formed on the first and second touch electrodes 410 and 420, respectively, by an etching process using the first mask pattern PR1 as an etching mask. By controlling a kind of etchant used in the etching process and an etching process time, the minute protrusions of the above-described cilia shape are formed on the upper surface of the first and second touch electrodes 410 and 420. If the etching process is completed, the first mask pattern PR1 formed on the first and second touch electrodes 410 and 420 is removed.

In FIG. 20 to FIG. 22, the photoresist PR is formed on the first and second touch electrodes 410 and 420 and then exposed and developed to form the first mask pattern PR1 on the first and second touch electrodes 410 and 420. However, a process of forming a first mask pattern PR2 in a mask mold 470 and transferring it onto the first and second touch electrodes 410 and 420 will be described by referring to FIG. 25 and FIG. 26.

Referring to FIG. 25 and FIG. 26, the first mask pattern PR2 is formed in the mask mold 470. The process of forming the mask pattern in the mask mold 470 is a process performed by soft lithography, which is known by a person skilled in the art, and therefore a detailed description thereof is omitted. The mask mold 470 formed with the first mask pattern PR2 is moved onto the first and second touch electrodes 410 and 420, and the first mask pattern PR2 is transferred to the first and second touch electrodes 410 and 420. Accordingly, like the above-described FIG. 22, the first mask pattern may be formed on the first and second touch electrodes 410 and 420.

As described above, in FIG. 25 and FIG. 26, the mask pattern is not formed on the first and second touch electrodes 410 and 420, and the mask pattern is formed on the one surface of the mask mold 470 and is transferred to the first and second touch electrodes 410 and 420.

In the touch sensor 400 formed according to the above-described process, the first and second minute protrusions 413 and 423 are formed on the first and second touch electrodes 410 and 420, thereby providing the adherence to at least one of the upper surface and the lower surface with respect to the touch substrate 404.

As described above, if the plurality of minute protrusions 413 and 423 are formed on the upper surface of the touch electrodes 410 and 420 formed on the touch substrate 404, the separate adhesive or the pressure sensitive adhesive is not required when adhering the other constituent elements and/or the polarizer 500 in the display device. Thus, the thickness of the touch sensor 400 may be reduced compared to the conventional art and the thickness of the display device including the touch sensor 400 may also be reduced.

The embodiments described herein are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," "at least one selected from," or "at least one . . . selected from," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and equivalents thereof.

| Description of symbols | |
|---|---|
| 300 display panel | 400 touch panel |
| 404 touch substrate | 410 first touch electrode |
| 411 first touch wiring | 412 first connection portion |
| 413 first minute protrusion | 420 second touch electrode |
| 421 second touch wiring | 422 second connection portion |
| 423 second minute protrusion | 430 insulating layer |

What is claimed is:

1. A touch sensor comprising:
a touch substrate;
a plurality of first touch electrodes extending in a first direction;
a plurality of second touch electrodes extending in a second direction crossing the first direction; and
a plurality of minute protrusions on at least one of the plurality of first and second touch electrodes,
wherein the plurality of first and second touch electrodes are formed on the same surface of the touch substrate, or are formed on different surfaces of the touch substrate,
wherein each of the first and second touch electrodes comprises a first surface facing the touch substrate and a second surface located on the opposite side of the first surface,
wherein the plurality of minute protrusions are formed on the second surface, and
wherein the plurality of minute protrusions have a cilia shape.

2. The touch sensor of claim 1, wherein
the plurality of minute protrusions are inclined at a set angle relative to the touch substrate.

3. The touch sensor of claim 1, wherein
ends of the minute protrusions are divided into a plurality of strands.

4. The touch sensor of claim 1, wherein
the plurality of first and second touch electrodes are formed on the same surface of the touch substrate,
the plurality of first touch electrodes extend in the first direction and are spaced from each other, and
the plurality of second touch electrodes extend in the second direction and are spaced from each other and do not overlap the plurality of first touch electrodes.

5. The touch sensor of claim 4, wherein
the plurality of first and second touch electrodes are on the same layer.

6. The touch sensor of claim 5, wherein
a pair of adjacent first touch electrodes of the plurality of first touch electrodes are connected by a first connection portion, and
a pair of adjacent second touch electrodes of the plurality of second touch electrodes are connected by a second connection portion crossing the first connection portion.

7. The touch sensor of claim 6, wherein
the first connection portion is positioned with the same layer as the plurality of first touch electrodes.

8. The touch sensor of claim 7, wherein
the first connection portion is integrally provided with the pair of adjacent first touch electrodes.

9. The touch sensor of claim 6, wherein
the second connection portion is positioned on a layer different from the plurality of second touch electrodes.

10. The touch sensor of claim 9, further comprising:
an insulating layer between first and second connection portions, and insulating the first and second connection portions.

11. The touch sensor of claim 6, further comprising:
a plurality of minute protrusions formed on an upper surface of the second connection portion.

12. The touch sensor of claim 1, wherein
the plurality of first and second touch electrodes are on different surfaces of the touch substrate, and
the plurality of first and second touch electrodes cross each other.

13. The touch sensor of claim 1, wherein
the plurality of first and second touch electrodes comprise: a metal nanowire, a metal mesh, carbon nanotubes, graphene, ITO, and/or IZO.

14. The touch sensor of claim 1, further comprising:
first and second touch wirings respectively connected to the first and second touch electrodes.

15. The touch sensor of claim 14, further comprising:
a touch driver on the touch substrate and connected to the first and second touch wiring.

16. A display device comprising:
a display panel comprising a plurality of pixels;
a touch panel on the display panel and configured to sense contact by an external object;
a cover window on the touch panel,
wherein the touch panel comprises:
  a touch substrate on the display panel;
  a plurality of first and second touch electrodes on the same surface or different surfaces of the touch substrate; and
  a plurality of minute protrusions on at least one of the first and second touch electrodes,
    wherein the plurality of first touch electrodes extend in a first direction and the plurality of second touch electrodes extend in a second direction crossing the first direction,
    wherein each of the first and second touch electrodes comprises a first surface facing the touch substrate and a second surface located on the opposite side of the first surface,
wherein the plurality of minute protrusions are formed on the second surface, and
wherein the plurality of minute protrusions have a cilia shape.

17. The display device of claim 16, wherein
the plurality of minute protrusions are inclined at a set angle relative to the touch substrate.

18. The display device of claim 16, wherein
ends of the minute protrusions are divided into a plurality of strands.

19. The display device of claim 16, wherein
the plurality of first and second touch electrodes are between the touch substrate and the cover window, and
the first and second touch electrodes are connected with the cover window by the plurality of protrusions.

20. The display device of claim 19, wherein
the plurality of first and second touch electrodes are on the same layer,
the plurality of first touch electrodes extend in the first direction and are spaced from each other, and
the plurality of second touch electrodes extend in the second direction and are spaced from each other and do not overlap the plurality of first touch electrodes.

21. The display device of claim 19, wherein
a pair of adjacent first touch electrodes of the plurality of first touch electrodes are connected to each other by a first connection portion with the same layer as the plurality of first touch electrodes, and the first connection portion is integrally provided with the pair of adjacent first touch electrodes, and
a pair of adjacent second touch electrodes of the plurality of second touch electrodes are connected by a second connection portion with a layer different from the plurality of second touch electrodes, and crosses the first connection portion.

22. The display device of claim 21, further comprising
an insulating layer between first and second connection portions, and insulating the first and second connection portions.

23. The display device of claim 21, further comprising:
a plurality of protrusions formed on an upper surface of the second connection portion.

24. The display device of claim 16, wherein
the plurality of first touch electrodes are between the touch substrate and the cover window, and are connected with the cover window by the plurality of minute protrusions, and
the plurality of second touch electrodes are between the touch substrate and the display panel, and are connected with the display panel by the plurality of minute protrusions.

25. A method for manufacturing a touch sensor, the method comprising:
forming a plurality of first and second touch electrodes on a same surface or different surfaces of a touch substrate, the plurality of first touch electrodes extending in a first direction and the plurality of second touch electrodes extending in a second direction crossing the first direction, the first and second touch electrodes each comprising a first surface facing the touch substrate and a second surface located on the opposite side of the first surface;
forming a first mask pattern on the first and second touch electrodes; and
forming a plurality of minute protrusions on the second surface of at least one of the first and second touch electrodes, respectively, by utilizing the first mask pattern,
wherein the plurality of minute protrusions have a cilia shape.

26. The method of claim 25, wherein
the forming of the first mask pattern comprises:
  forming a photosensitive film on the first and second touch electrodes; and
  exposing and developing the photosensitive film.

27. The method of claim 25, wherein
the forming of the first mask pattern comprises:
  forming a same mask pattern as the first mask pattern to be formed on the first and second touch electrodes on a mask mold; and
  transferring the mask pattern from the mask mold onto the first and second touch electrodes.

28. The method of claim 25, wherein,
in the forming of the plurality of minute protrusions, the first and second touch electrodes are etched to form the plurality of minute protrusions by utilizing the first mask pattern as an etching mask.

29. The method of claim 25, wherein
the forming of the plurality of first and second touch electrodes comprises:
  forming a conductive layer on the touch substrate;
  forming a second mask pattern on the conductive layer; and
  patterning the conductive layer into the first and second touch electrodes by using the second mask pattern.

30. The method of claim 25, wherein
the plurality of first and second electrodes comprise: a metal nanowire, a metal mesh, carbon nanotubes, graphene, ITO, and/or IZO.

* * * * *